United States Patent [19]
Chakravorty et al.

[11] Patent Number: 5,436,504
[45] Date of Patent: Jul. 25, 1995

[54] INTERCONNECT STRUCTURES HAVING TANTALUM/TANTALUM OXIDE LAYERS

[75] Inventors: Kishore K. Chakravorty, Issaquah; Minas H. Tanielian, Bellevue, both of Wash.

[73] Assignee: The Boeing Company, Seattle, Wash.

[21] Appl. No.: 64,794

[22] Filed: May 19, 1993

Related U.S. Application Data

[60] Continuation of Ser. No. 748,105, Aug. 21, 1991, abandoned, which is a division of Ser. No. 520,174, May 7, 1990, Pat. No. 5,098,860.

[51] Int. Cl.$^6$ .................................... H05K 1/02
[52] U.S. Cl. .................................. 257/758; 257/761; 257/762; 174/258
[58] Field of Search .................. 357/71, 68, 23.7; 257/752, 758, 759, 761, 762; 174/256, 257, 258, 266; 361/750, 751

[56] References Cited

U.S. PATENT DOCUMENTS

| | | | |
|---|---|---|---|
| 3,634,203 | 1/1972 | McMahon et al. | 204/15 |
| 3,741,880 | 6/1973 | Shiba et al. | 204/15 |
| 3,766,445 | 10/1973 | Reuter et al. | 257/752 |
| 3,862,017 | 1/1975 | Tsunemitsu et al. | 204/15 |
| 3,864,217 | 2/1975 | Takahata et al. | 204/15 |
| 4,067,099 | 1/1978 | Ito et al. | 29/571 |
| 4,088,546 | 5/1978 | Wu et al. | |
| 4,158,613 | 6/1979 | Sogo | 204/15 |
| 4,295,183 | 10/1981 | Miersch et al. | 361/403 |
| 4,307,132 | 12/1981 | Chu et al. | 427/90 |
| 4,531,144 | 7/1985 | Holmberg | 357/71 |
| 4,554,229 | 11/1985 | Small, Jr. | 430/17 |
| 4,633,035 | 12/1986 | McMonagle | 174/68.5 |
| 4,705,606 | 11/1987 | Young et al. | 204/15 |
| 4,720,736 | 1/1988 | Takafuji et al. | 357/23.7 |
| 4,723,838 | 2/1988 | Aoki et al. | 357/23.7 |

FOREIGN PATENT DOCUMENTS

| | | |
|---|---|---|
| 190820 | 8/1986 | European Pat. Off. . |
| 60-198731 | 8/1985 | Japan . |
| 63-185045 | 7/1988 | Japan . |
| 2119570 | 11/1983 | United Kingdom . |

OTHER PUBLICATIONS

Moriya, K. et al., "High-Density Multilayer Interconnection With Photo-Sensitive Polymide Dielectric and Electroplatin Conductor," Proceedings 34th Electronics Component Conference IEEE, pp. 82-87 (1984).

Vermilyeo, D. A., "Stresses in Anodic Films," Journal of the Electrochemical Society, 110:345-346 (1963).

*Primary Examiner*—William D. Larkins
*Attorney, Agent, or Firm*—Christensen, O'Connor, Johnson & Kindness

[57] ABSTRACT

A method of fabricating a high-density multilayer copper/polyimide interconnect structure utilizing a blanket tantalum/tantalum oxide layer that electrically connects all of the electroplating seed layers to the edge of the substrate; upon completion of the electroplating process, the excess tantalum/tantalum oxide layer is etched off to produce isolated conductor lines. A multilayer copper/polyimide interconnect structure may be fabricated by repeating this fabrication sequence for each layer.

11 Claims, 2 Drawing Sheets

INTERCONNECT STRUCTURES HAVING TANTALUM/TANTALUM OXIDE LAYERS

This is a continuation of Ser. No. 07/748,105 filed Aug. 21, 1991, now abandoned, which was a divisional of Ser. No. 07/520,174 filed May 7, 1990, now U.S. Pat. No. 5,098,860.

FIELD OF THE INVENTION

This invention relates to processes for producing high reliability, planar metal/dielectric high-density interconnect structures, and to the resulting structures.

BACKGROUND OF THE INVENTION

The availability of high speed integrated circuit chips has resulted in a need for suitable interconnection technology that offers high wiring density, good electrical characteristics for the propagation of high speed signals, and good thermal performance. Multilayer interconnection systems with fine line conductors and associated ground planes have been proposed for applications in high performance systems. C. W. Hoet al., IBM J. Res. Der., 26:286–296 (May 1982), and C. W. Hoet al., VLSI Electronics: Microstructure Science, 5(3):103–143 (Academic, New York, 1982). Fine geometry copper conductor lines defined in a photolithographically patterned layer of a low-dielectric constant polymer, such as a polyimide, have emerged as a versatile packaging approach for the conductive interconnection lines between densely packed integrated circuit chips in high performance systems.

The customary approach to fabricating interconnect structures uses copper conductor lines that are several microns thick. The metal is deposited using a thin-film technique and is subsequently patterned using a resist mask. A wafer substrate with the patterned conductor lines is then spin-coated with a dielectric (e.g., polyimide). Planarity of the overall layer, which is of crucial importance for good performance and manufacturing yield, is poor unless one employs multiple coats of the dielectric film. The process is tedious and due to the presence of thick dielectric films, the interconnect structures are subjected to high levels of stress, resulting in poor yields and lowered reliability.

An alternative approach, which circumvents the limitations of the customary approach, uses photosensitive polyimide as the dielectric. In this approach, the polyimide film is photopatterned to create trenches into which the copper conductor lines are electroplated to a height equal to the polyimide film thickness, thus assuring near perfect planarity of all the individual signal layers. See K. K. Chakravorty, Proc. of Elect. Comp. Conf., 135–142 (1988); and Chakravorty et al., Proc. 3rd Int. SAMPLE Elec. Conf., 3:1213–1223 (1988).

In general, the alternative approach utilizes the following steps to produce conductive features having fine geometry: (1) depositing a thin layer of a metallic seed layer on a dielectric substrate, (2) patterning the seed layer to form fine geometry lines that serve as the electroplating base for the conductor lines, (3) spin-coating a layer of a photosensitive dielectric (e.g., photosensitive polyimide) over the dielectric substrate and patterned seed layer, (4) photolithographically patterning the layer of the photosensitive dielectric to form dielectric features (defined by trenches) having fine geometry, and also uncovering the seed layer between the dielectric features, and (5) electroplating an electrically conductive material between the patterned dielectric features onto the metallic seed layers to form electrically conductive features.

The alternative approach requires the presence of an electroplating seed layer in the polyimide trenches, which needs to be electrically connected to the cathode of the electroplating bath during step (5), described above. A typical multichip module substrate may use a design such that it is not possible to extend every interconnection line to the edge of the module so as to electrically connect it to the cathode of the electroplating bath. In order to make this alternative approach work under such conditions, a technique is required whereby the "isolated" lines may be electrically connected to the edge and, thus, the cathode of the bath during the electroplating step. Upon completion of the plating process, the electrical connection may then be severed, restoring the electrical isolation of the conductor lines. This approach can be used for every signal layer in a multilayer high-density interconnect structure.

There are several ways of forming these temporary electrical connections to the outer edge of the substrate so that electroplating of "isolated" lines can be done. One such method is given in U.S. Pat. No. 4,661,214. This method requires the presence of conductive "islands" under the polyimide which are initially conductive and they are rendered resistive by a temperature treatment step. One drawback of such an approach is that the material system is based on silver (Ag) in contact with a chalcogenide film. Control of the stoichiometry of the film is often difficult and affects the temperature of disconnection. The material system may generate by-products during the baking process which may adversely affect the reliability of the copper-based interconnect structures by leading to corrosion. Another drawback is the poor adhesion of silver to the substrate material (silicon, etc.). In the present approach, this electrical connection is achieved by a blanket sputtered layer of Ta metal. Since any conductive metal used for such a process during the electroplating step will get copper deposited on it, it is necessary to cover its surface by an insulating layer to prevent this from happening. However, if a thin layer of an electrically conductive material is utilized to connect such features to the edge, complete and even coverage of its upper surface with an insulating layer, including edge coverage, is hard to achieve. This insulating layer is necessary so that there is no plating taking place except in the previously photodefined dielectric trenches with the plating base seed layers at their bottom. If the overlying electrically insulating film contains microscopic defects or weak spots, these will cause substantial problems during the electroplating step, such as unwanted electroplating and nodule formation, resulting in an unsatisfactory conductive line. Another problem that needs to be addressed is that of preventing the metal lines that are in contact with the photosensitive dielectric, especially a polyimide, from being corroded by moisture and ionic contaminants present in the dielectric. Yet another problem that needs to be addressed is that of poor adhesion between electroplated metal lines and the dielectric, at their interfaces.

SUMMARY OF THE INVENTION

The above problems, and others, have been addressed and solved by the present invention, which provides a method for isolating the conductors from corrosion-inducing contaminants within the insulator of an interconnect structure, comprising the step of forming a bilayer of tantalum metal and tantalum oxide between the conductor and the insulator in the interconnect structure. In one embodiment, the invention encompasses a method for the fabrication of high-density multilayer interconnect structures that enables the interconnection of "isolated" structures during the electroplating process. In one important aspect, this approach uses a blanket tantalum (Ta) layer that electrically connects all of the electroplating seed layers to the edge of the wafer. This is followed by a step wherein tantalum oxide ($Ta_2O_5$) is grown on the surface of the Ta layer. After clearing the seed layer areas, a copper electroplating step is carried out. Upon completion of the electroplating process, the excess $Ta/Ta_2O_5$ layer is etched off to render the lines electrically isolated once again. In another embodiment, a $Ta/Ta_2O_5$ bilayer may be formed on top of the conductor line to passivate the top thereof.

Anodic tantalum oxide films are among the most thoroughly investigated and densest anodic oxide films known. They have the property of normally being pinhole free, which renders them useful for applications in thin film capacitors. This property of the anodic tantalum oxide films, among others, has been used to address the problems set forth above in fabricating interconnect structures. In the context of this invention, tantalum oxide films provide a pinhole free insulating layer preventing deposition of any metal on an underlying electrically conductive tantalum layer during the electroplating process. The $Ta/Ta_5$ layer also serves as an effective barrier against corrosion of metal by moisture and ionic contaminants present in the polyimide dielectric, and further, it improves the adhesion of metal/polyimide interfaces. Moreover, tantalum oxide serves as a passivating layer around the metal (copper) conductor lines and thus significantly improves the reliability of the resulting interconnect structures.

A method of the present invention includes the following steps:
(a) providing a substrate coated on its upper surface with patterned electroplating seed layers, and a photosensitive dielectric layer photopatterned thereover, which exposes the electroplating seed layers;
(b) depositing a thin layer of tantalum over the dielectric layer and exposed electroplating seed layers;
(c) forming a thin layer of anodic tantalum oxide on the upper surface of the tantalum layer to produce a tantalum/tantalum oxide layer;
(d) patterning the tantalum/tantalum oxide layer to expose the electroplating seed layers while maintaining electrical contact between the electroplating seed layers and the edges of the substrate through the tantalum layer;
(e) electroplating a conductive metal over the electroplating seed layers in the trenches of the photopatterned dielectric layer; and
(f) etching the exposed tantalum/tantalum oxide layer to electrically isolate all the conductors and to produce a planar interconnect structure.

The above steps are preferably applied to a system that employs copper as the electrically conductive metal and a photosensitive polyimide as the dielectric (i.e., a copper/polyimide system). However, the method is expected to be applicable to any spin-on dielectric and electroplatable metal system. The above-described steps are depicted in FIGS. 1–6, which are described in greater detail herein below. One of the advantages of forming an anodic tantalum oxide layer on top of a tantalum layer is that the tantalum oxide forms an even, self-aligned covering wherever there is underlying tantalum. Thus, after step (c), there is essentially no exposed tantalum and, due to the characteristics of an anodically formed tantalum oxide layer, there are substantially no pinholes, defects, or weak spots in the tantalum oxide layer. Accordingly, during the subsequent electroplating step (e), the conductive material fills the trenches in the dielectric (polyimide) layer over the seed layers smoothly and evenly, and without any substantial nodule formation at the edges during electroplating.

Other objects, features, and advantages of the present invention will be readily apparent from the following description of certain preferred embodiments thereof, taken in conjunction with the accompanying drawings. It is to be understood that variations and modifications may be effected without departing from the spirit and scope of the novel concepts of the disclosure herein.

DETAILED DESCRIPTION OF PREFERRED EMBODIMENTS OF THE INVENTION

As noted above, the present invention involves a method for the fabrication of a high-density multilayer interconnect structure, preferably employing a copper/polyimide system, which enables interconnection of isolated structures during the electroplating process, followed by removal of the interconnecting layer. The approach utilizes a blanket tantalum/tantalum oxide layer that electrically connects all of the electroplating seed layers to the edge of the substrate. After the electroplating process has been completed, the excess tantalum/tantalum oxide layer is etched off. As noted above, FIGS. 1–6 outline the various steps of the method of the present invention.

Figure 1:
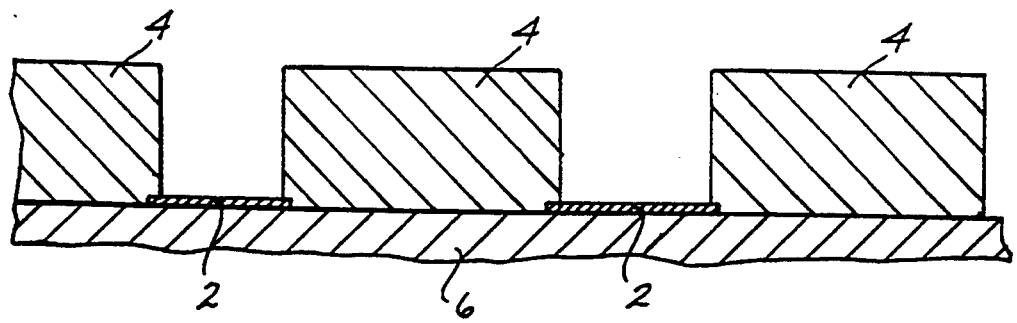
FIGS. 1–6 are schematic cross-sectional views representing the sequence of steps comprising the method for fabricating one layer of a planar metal/dielectric system. The steps can be repeated to produce a high-density multilayer interconnect structure.

FIG. 1 depicts a pattern of electroplating seed layers 2 lying in trenches defined by a dielectric layer 4. Both the electroplating seed layers 2 and the dielectric layer 4 are on the upper surface of a substrate 6. The electroplating seed layers 2 are typically comprised of a combination of two different metal layers. A top layer consists of a material which is suitable for electroplating a conductive metal such as copper. A bottom layer promotes adhesion of the top layer to the substrate 6. Typically, chromium is employed as the adhesion layer and gold is employed as the plating seed layer. Other conventionally used materials may also be employed as the adhesion layer and the plating seed layer, as desired. For example, titanium may also be used as the adhesion layer and copper can be used as the plating seed layer.

The substrate 6 may be any dielectric substrate that is consistent with the formation of a high-density interconnect structure. A preferred substrate is a silicon wafer.

The specific nature of the photosensitive dielectric of the present invention is not critical. Photosensitive polyimides are preferred. The unexposed photosensitive polyimides are initially susceptible to attack by developing solvents used in the photolithographic patterning art, such as gamma-butyrolactone, cyclopentanone, cyclohexanone, and the like. The resistance of the photosensitive polyimide to attack by developing solvents can be increased by irradiating the polyimides with ultraviolet radiation.

Examples of preferred photosensitive polyimides are those commercially available under the trademark PROBIMIDE TM 400 Series from the Ciba-Geigy Corporation. Other examples include SELECTILUX® HTR-3 200 Series, available from EM Industries, Inc., Hawthorne, N.Y.; PAL, produced by Hitachi Chemicals; PYRALIN TM PD, produced by E. I. DuPont de Nemours & Co.; and PHOTONEECE TM, produced by Toray Industries, and the like.

The electroplating seed layers are laid down and patterned by conventional lithographic and etching techniques. The polyimide is photopatterned over the plating seed layers such that most of the seed layer is exposed, as depicted in FIG. 1. Methods that may be used to produce the starting structure shown in FIG. 1 are described in U.S. Ser. No. 07/241,693, filed on Sep. 6, 1988, which is hereby incorporated by reference.

In order to harden the polyimide, a baking step is advantageously carried out. A typical baking step involves heating for about 60–120 minutes, preferably about 90 minutes, at from about 200°–300° C., preferably about 300° C.

Figure 2:
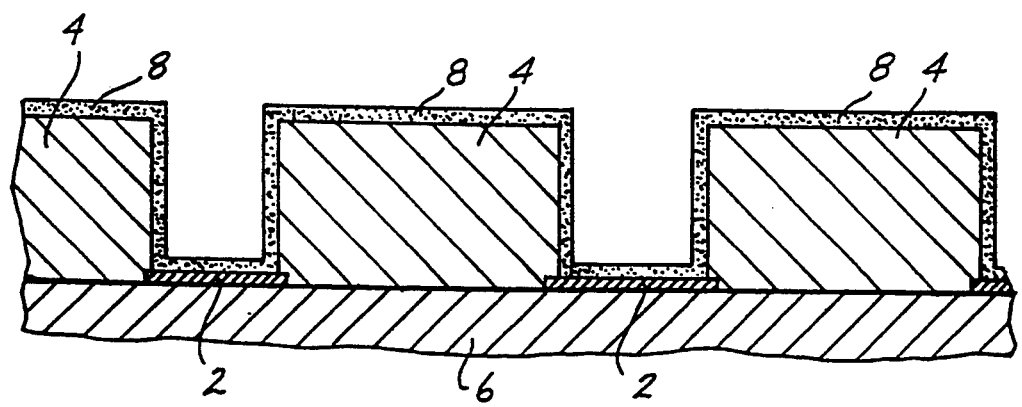

The next step involves depositing a thin tantalum film over the starting structure shown in FIG. 1, to produce a coated structure depicted in FIG. 2. The tantalum film, 8, may be deposited by a sputter-deposition technique onto the polyimide/seed layer coated substrate. A representative sputter-deposition technique is described in such standard texts as *The Handbook of Thin Film Technology*, Maissel and Glang, Eds. (McGraw, 1970) and *Thin Film Phenomena*, K. L. Chopra (Robert E. Krieger Publishing Co., 1979).

The thickness of the tantalum layer can vary depending upon the geometry of the polyimide/seed layer structure. In all cases, the layer should be thick enough to provide substantially complete coverage of the polyimide but not so thick as to result in cracking of the tantalum layer due to stress. For most geometries, the tantalum layer will preferably be from about 1000 Å to 1500 Å, more preferably about 1500 Å. The sputter-deposited tantalum film 8 readily provides good sidewall coverage over the polyimide steps, as drawn in FIG. 2, the latter being typically 5 microns thick and 15–35 microns wide.

Figure 3:
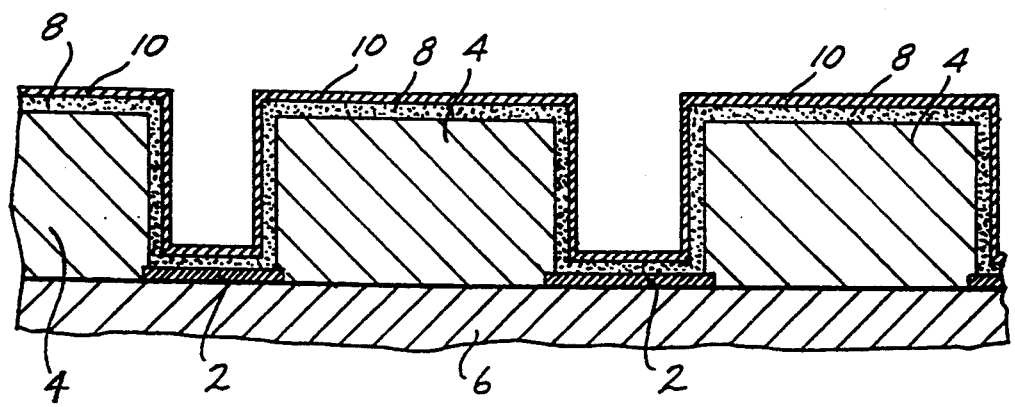

Referring to FIG. 3, the blanket tantalum layer is next anodized to produce a coating of anodic tantalum oxide 10 over the tantalum layer 8. The tantalum oxide layer is primarily $Ta_2O_5$. As with the tantalum layer, the tantalum oxide layer should be thick enough to provide substantially complete and preferably uniform electrically insulating coverage of the underlying tantalum layer, but not so thick that sufficient stress develops in the tantalum oxide layer to result in defects. The thickness of this film will preferably range from about 400 Å to about 800 Å, most preferably about 600 Å.

Standard anodization procedures can be utilized to produce the tantalum oxide overlayer on the tantalum layer. However, it has been found that if a conventional aqueous electrolyte solution is utilized in the anodization procedure, the tantalum oxide film that results may be unsatisfactory, primarily because of cracks resulting from stress in the tantalum oxide layer. See D. A. Vermilyeo, *J. Electrochem. Soc.* 110:345–346 (1963). In order to ensure growth of dense tantalum oxide with minimum stress generation, the inventors prefer to use a 2% ammonium borate [e.g., ammonium tetraborate tetrahydrate]/2% water in ethylene glycol anodization bath instead of an aqueous electrolyte solution; nevertheless, a water bath may be suitable for some systems.

The anodization process was carried out at a current density of about 2 ma/cm$^2$ for about 8 minutes. This condition provided about 600 Å of tantalum oxide formed with an acceptable level of stress. It is anticipated that depending upon the substrate topography, etc., a different set of anodization conditions may be desirable.

The underlying tantalum layer will ensure good electrical interconnection of all of the individual plating seed layers, whereas the top tantalum oxide layer provides a dielectric layer which does not electroplate. Moreover, in view of the near pinhole-free nature of the anodic tantalum oxide layer, the subsequent electroplating step can proceed without nodule formation to result in a superior electroplated metal conductor line.

Figure 4:
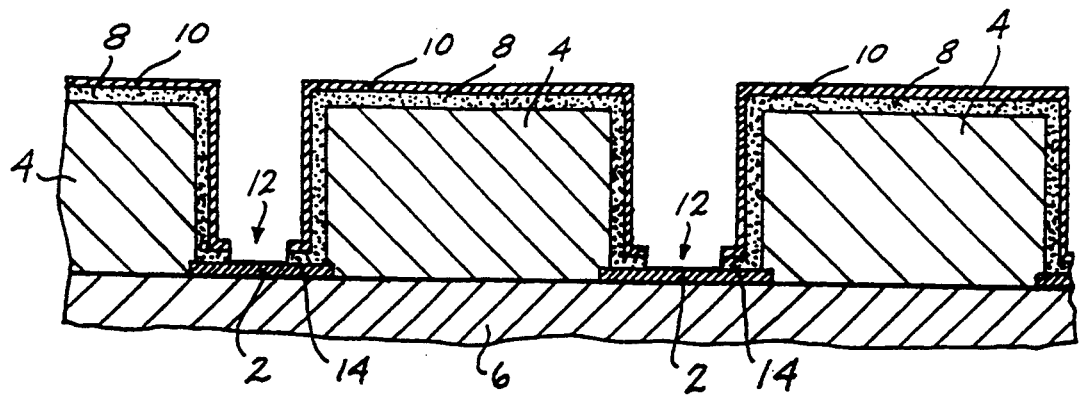

Referring to FIG. 4, the tantalum/tantalum oxide layer 8/10 is next patterned to expose the underlying electroplating seed layers 2 at the bottoms of the trenches between the dielectric steps. The technique employed for patterning is a standard resist masking technique. Etching of the tantalum/tantalum oxide layers is carried out in a plasma, preferably employing a plasma system of two gases, one of which is a fluorine-containing gas, for example: $SF_6:O_2$ or $CF_4:O_2$. Using an $SF_6:O_2$ plasma, typical conditions involve a total pressure of 150 mTORR, a flow ratio of 100:10 (100 sccm $SF_6$, 10 sccm $O_2$) and a power of about 200 watts. Under these conditions, etch rates are approximately 400 Å per minute. Etching results in exposure of the underlying seed layer at location 12. Etching should also be carried out so as to retain a sufficient overlap (i.e. 14) of the tantalum/tantalum oxide layer over the seed layer to ensure good electrical contact between the tantalum and the plating seed layer. The typical size of overlap 14 will be about 2–3 microns.

After the etching step described above, a conducting metal will be electroplated in the trench between the dielectric steps. To prepare the seed layers 2 in FIG. 4 for the electroplating step, the seed layers may optionally but preferably be treated so as to remove at least several monolayers thereof, in the manner set forth in U.S. Ser. No. 07/312,890, filed Feb. 17, 1989, which is incorporated by reference herein.

Figure 5:
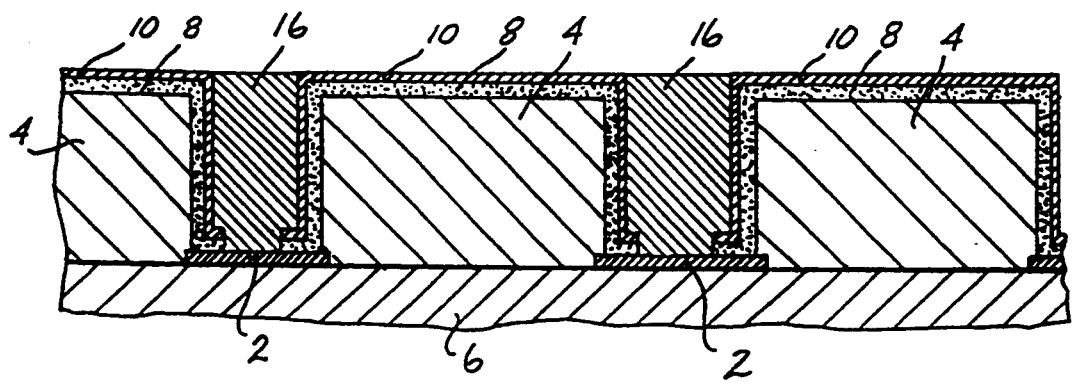

FIG. 5 shows the resulting structure after a conducting metal 16 has been electroplated in the trench between the dielectric steps 4 and above the electroplating seed layer 2. The electrically conductive metal is deposited using standard electroplating techniques. Due to the presence of the tantalum oxide layer on top of the tantalum layer, no deposition of electroplated metal takes place in the regions that are not over the seed layers 2. The electroplating process is controlled so as to plate the electrically conductive metal to a thickness approximately equal to the height of the polyimide steps 4 covered by the tantalum/tantalum oxide layer 8/10 to result in a substantially planar structure.

As noted above, one of the advantages of electroplating in the presence of the tantalum/tantalum oxide layer is that the electroplating proceeds without formation of nodules due to concurrent electroplating at different focal points, i.e., defects in the anodic tantalum oxide overlayer. The tantalum oxide layer also serves as a passivating layer around the electroplated lines. The resulting electroplated lines are superior to conventional lines in terms of their corrosion resistance. The resulting conductor/dielectric interconnect layer is planar, which results in improved manufacturability and performance. Also, improved adhesion between the conductor and the dielectric is obtained.

Figure 6:
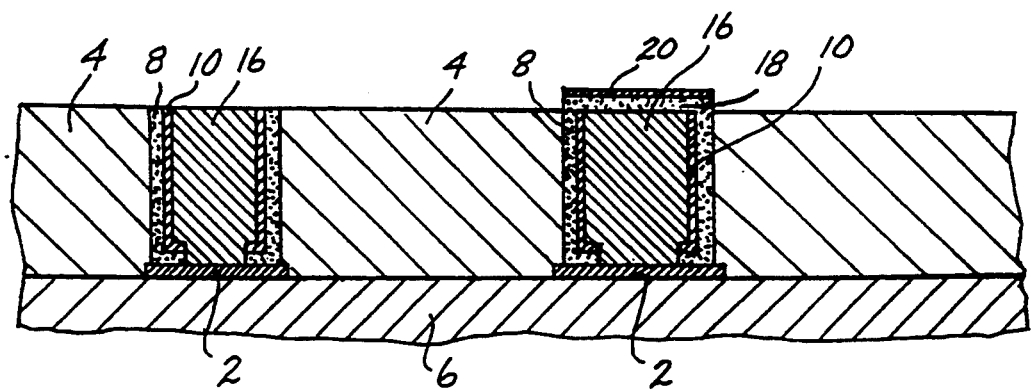

Referring to FIG. 6, after completion of the electroplating step, the coated substrate 6 is exposed to another etching step using a plasma, such as one referred to above in connection with the etching step of FIG. 4. For example, the same $SF_6:O_2$ plasma used for patterning of the tantalum/tantalum oxide layer may be employed in this step. As shown in FIG. 6 (left-hand side), this causes complete removal of the exposed tantalum/tantalum oxide layer (i.e., the layers extending above the height of the polyimide steps). As a result, conductor lines are restored to their electrically isolated status and a planar structure is produced. This gas mixture does not attack the plated copper so no resist masking step is necessary. In an extension of the basic procedure, to further improve the corrosion resistance of the conductor, another $Ta/Ta_2O_5$ layer can be formed on top of the conductor lines so that conductor 16 is totally encapsulated by the presence of upper layer 18/20 as shown in FIG. 6 (right-hand side).

A multilayer electroplated metal/dielectric interconnect structure may be fabricated by repeating the above-described fabrication sequence for each of several layers. When microelectronics, such as high density multilayer interconnect structures, are prepared in accordance with the present invention, one layer of the dielectric composition can serve as the base for another layer of the dielectric composition, including another set of conductor lines. After the conductor lines have been electroplated onto the initial conductor seed lines, another layer of the dielectric composition can be provided on top of the initial layer by conventional means such as spin coating. Onto this layer can be deposited another set of conductor lines as described above.

As shown in FIG. 6, the metal conductor lines 16 are shielded from the dielectric walls 4 by a protective tantalum/tantalum oxide layer 8/10 and 18/20. The hygroscopic nature of polyimide as the dielectric, coupled with ionic contaminants present in this formulation, can produce problems that threaten reliability. For example, corrosion of aluminum and copper in contact with polyimide has been previously reported. Protective metal coatings on copper such as nickel or chromium coatings have been used as a passivating layer. However, to the inventors' knowledge, tantalum/tantalum oxide has not previously been employed as a coating in this application.

The intervening tantalum/tantalum oxide layer can also improve adhesion between the dielectric and the metal conductor lines.

While the present invention has been described in relation to various embodiments, including the preferred embodiments and parameters, after reading the foregoing specification one of ordinary skill in the art will be able to effect various changes, substitutions of equivalents, and other alterations without departing from the broad concepts disclosed herein. It is therefore intended that the scope of Letters Patent granted hereon will be limited only by the definition contained in the appended claims and equivalents thereof.

The embodiments of the invention in which an exclusive property or privilege is claimed are defined as follows:

1. A metal/dielectric high-density interconnect structure produced by the method comprising the steps:
    (a) providing a substrate coated on its upper surface with patterned electroplating seed layers, and a photosensitive dielectric layer photopatterned thereover, which exposes the electroplating seed layers through trenches in the dielectric layer, the electroplating seed layers being conductive;
    (b) depositing on and within the trenches of said dielectric layer and on said exposed electroplating seed layers a substantially continuous layer of tantalum;
    (c) forming a substantially continuous layer of anodic tantalum oxide on said tantalum layer to produce a tantalum/tantalum oxide layer;
    (d) patterning said tantalum/tantalum oxide layer to expose said electroplating seed layers while maintaining electrical connection between said electroplating seed layers and said tantalum layer;
    (e) electroplating a metal conductor on said electroplating seed layers to form a pattern of unexposed and exposed tantalum/tantalum oxide layers, the unexposed tantalum/tantalum oxide layers being covered by the metal conductor; and
    (f) removing the exposed tantalum/tantalum oxide layers to electrically isolate said metal conductor lines, and to thereby produce a planar interconnect structure, wherein the tantalum/tantalum oxide layers remain within the trenches between the dielectric layer and the conductor.

2. The structure of claim 1, wherein the dielectric is a polyimide and the metal is copper.

3. A multi-layer metal/dielectric high-density interconnect structure produced according to the method comprising the steps:
    (a) providing a substrate coated on its upper surface with patterned electroplating seed layers covered by a photosensitive dielectric layer, and photopatterning trenches in the dielectric layer to thereby expose the electroplating seed layers, followed by baking the substrate to harden the dielectric layer;
    (b) depositing on and within the trenches of said dielectric layer and on said exposed electroplating seed layers a substantially continuous layer of tantalum;
    (c) forming a substantially continuous layer of anodic tantalum oxide on said tantalum layer to produce a tantalum/tantalum oxide layer;
    (d) patterning said tantalum/tantalum oxide layer to expose said electroplating seed layers while maintaining electrical connection between said electroplating seed layers and said tantalum layer;
    (e) electroplating a metal conductor on said electroplating seed layers to form a pattern of unexposed and exposed tantalum/tantalum oxide layers, the unexposed tantalum/tantalum oxide layers being covered by the metal conductor;
    (f) removing the exposed tantalum/tantalum oxide layers to electrically isolate said metal conductor lines, thereby producing a planar interconnect structure, wherein the tantalum/tantalum oxide layers remain within the trenches between the dielectric layer and the conductor; and (g) combining a plurality of said planar interconnect structures to form a multilayer/dielectric high-density interconnect structure.

4. The structure of claim 3, wherein the dielectric is a polyimide and the metal is copper.

5. An interconnect structure comprising copper conductors within trenches in a patterned insulator, the conductors being isolated from the patterned insulator by a layer of tantalum metal coating the insides of the trenches between the insulator and the conductors and a layer of anodic tantalum oxide overlying the layer of tantalum metal within the trenches, the layer of anodic tantalum oxide being disposed between the tantalum metal and the conductors.

6. An interconnect structure comprising conductors within trenches in a patterned insulator, the conductors being isolated from the patterned insulator by a layer of tantalum metal coating the insides of the trenches between the insulator and the conductors and a layer of anodic tantalum oxide overlying the layer of tantalum metal within the trenches, the layer of anodic tantalum oxide being disposed between the tantalum metal and the conductors and, wherein the insulator is polyimide.

7. An interconnect structure, comprising:
a substrate;
at least one seed layer overlying a portion of the substrate, said seed layer comprising a material suitable for electroplating a conductive metal;
a copper conductor deposited on the seed layer and having a base in contact with the seed layer and lateral sidewalls defining a conductor height;
a layer of anodic tantalum oxide adjacent and contacting the sidewalls;
a layer of tantalum adjacent and contacting the layer of anodic tantalum oxide; and
an insulator overlying the substrate, the insulator having at least one trench extending through the insulator to the seed layer, the conductor being disposed within the trench, the lateral sides of the trench being in contact with the tantalum and extending to the height of the sidewalls, the layer of tantalum being disposed between the sides of the insulator trench and the layer of anodic tantalum oxide.

8. An interconnect structure, comprising;
a substrate;
at least one seed layer overlying a portion of the substrate, said seed layer comprising a material suitable for electroplating a conductive metal;
a conductor deposited on the seed layer and having a base in contact with the seed layer and lateral sidewalls defining a conductor height;
a layer of anodic tantalum oxide adjacent and contacting the sidewalls;
a layer of tantalum adjacent and contacting the layer of anodic tantalum oxide; and
a polyimide insulator overlying the substrate, the insulator having at least one trench extending through the insulator to the seed layer, the conductor being disposed within the trench, the lateral sides of the trench being in contact with the tantalum and extending to the height of the sidewalls, the layer of tantalum being disposed between the sides of the insulator trench and the layer of anodic tantalum oxide.

9. An interconnect structure, comprising:
a substrate, wherein the substrate is comprised of insulating material;
a seed layer overlying a portion of the substrate;
a first dielectric layer overlying the substrate and having a trench extending through a portion of the dielectric layer such that the seed layer is not completely covered by the dielectric layer, the trench having sidewalls;
a tantalum layer coating each of the sidewalls within the trench and extending from the seed layer;
a tantalum oxide layer coating at least a portion of the tantalum layer on each of the sidewalls within the trench; and
a conductor deposited on the seed layer between the tantalum oxide layer on each of the sidewalls within the trench, wherein the seed layer is formed of conductive material other than tantalum and other than the conductor, and the conductor is a conductive metal other than tantalum.

10. The interconnect structure of claim 9 wherein the dielectric layer includes a plurality of trenches with sidewalls, each trench having a seed layer disposed at the bottom thereof on the substrate, the interconnect structure further comprising a conductor within each of the trenches with a layer of tantalum and a layer of tantalum oxide coating the sidewalls of the trenches between the conductor and the dielectric layer.

11. The interconnect structure of claim 10, further comprising a second dielectric layer overlying the first dielectric layer, said second dielectric layer having trenches with sidewalls extending therethrough with tantalum and tantalum oxide layers coating the sidewalls and conductors disposed in the trenches between the tantalum and tantalum oxide layers.

* * * * *